United States Patent [19]

Cambou et al.

[11] Patent Number: 5,091,330
[45] Date of Patent: Feb. 25, 1992

[54] METHOD OF FABRICATING A DIELECTRIC ISOLATED AREA

[75] Inventors: Bertrand F. Cambou; Juergen Foerstner, both of Mesa; H. Ming Liaw, Scottsdale, all of Ariz.

[73] Assignee: Motorola, Inc., Schaumburg, Ill.

[21] Appl. No.: 635,071

[22] Filed: Dec. 28, 1990

[51] Int. Cl.$^5$ ............................................ H01L 21/76
[52] U.S. Cl. ....................................... 437/62; 437/86; 437/974; 148/DIG. 12
[58] Field of Search ............. 148/DIG. 12, DIG. 135; 437/86, 62, 974

[56] References Cited

U.S. PATENT DOCUMENTS

| | | | |
|---|---|---|---|
| 3,423,823 | 1/1969 | Ansley | 437/226 |
| 3,508,980 | 4/1970 | Jackson, Jr. et al. | 148/DIG. 12 |
| 3,559,282 | 2/1971 | Lesk | 148/DIG. 28 |
| 4,774,196 | 9/1988 | Blanchard | 437/24 |
| 4,878,957 | 11/1989 | Yamaguchi et al. | 148/DIG. 12 |
| 4,891,329 | 1/1990 | Reisman et al. | 148/DIG. 12 |
| 4,948,748 | 8/1990 | Kitahara et al. | 148/DIG. 12 |

FOREIGN PATENT DOCUMENTS

| | | | |
|---|---|---|---|
| 62-122148 | 6/1987 | Japan | 148/DIG. 12 |
| 1-12543 | 1/1989 | Japan | 148/DIG. 12 |
| 1-215041 | 8/1989 | Japan | 148/DIG. 12 |
| 2-21631 | 1/1990 | Japan | 437/86 |
| 2-45953 | 2/1990 | Japan | 437/86 |
| 2206445 | 1/1989 | United Kingdom | 148/DIG. 12 |

OTHER PUBLICATIONS

Kimura, M., "Epitaxial Film Transfer . . . Substrate", Applied Physics Letters 43(3), Aug. 1983, pp. 263–265.
Brooks, A., "Low Temperature Electrostatic . . . Glass", J. Electrochem. Soc. Solid State Science & Tech. 119(4), 4/72, pp. 545–546.
Lasky, J., "Wafer Bonding for Silicon-on-Insulator Technologies", Appl. Phys. Lett. 48(1), Jan. 86, pp. 78–80.

*Primary Examiner*—Olik Chaudhuri
*Assistant Examiner*—G. Fourson
*Attorney, Agent, or Firm*—Miriam Jackson; Joe E. Barbee

[57] ABSTRACT

A dielectric isolated area is formed by bonding a first and a second wafer. A first wafer having a first and a second major surface is provided. A second wafer having a first and a second major surface is then provided. Trenches are formed in the first surface of the second wafer. Subsequently, a dielectric layer which can be planarized is formed on the surface of the second wafer having trenches formed therein. The first and second wafers are then bonded so that the dielectric layer and the first surface of the first wafer are bonded to each other. A portion of the second surface of the second wafer is then removed down to at least the bottom of each trench.

24 Claims, 3 Drawing Sheets

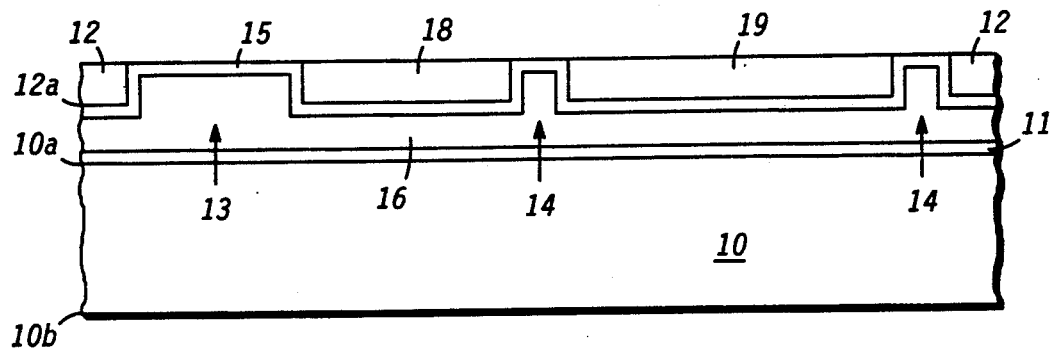
FIG. 5
FIG. 6
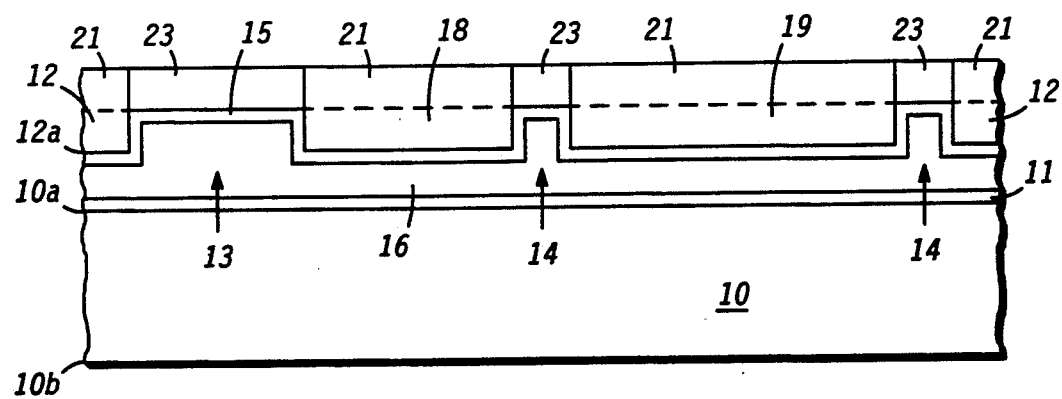

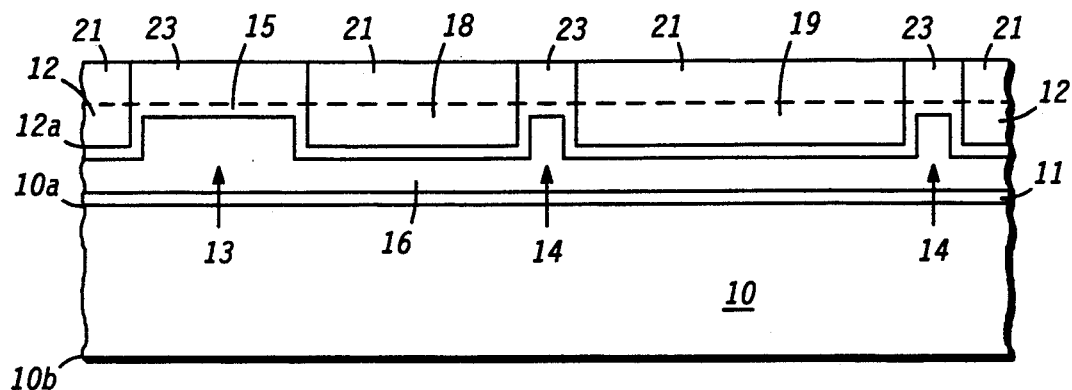
FIG. 7
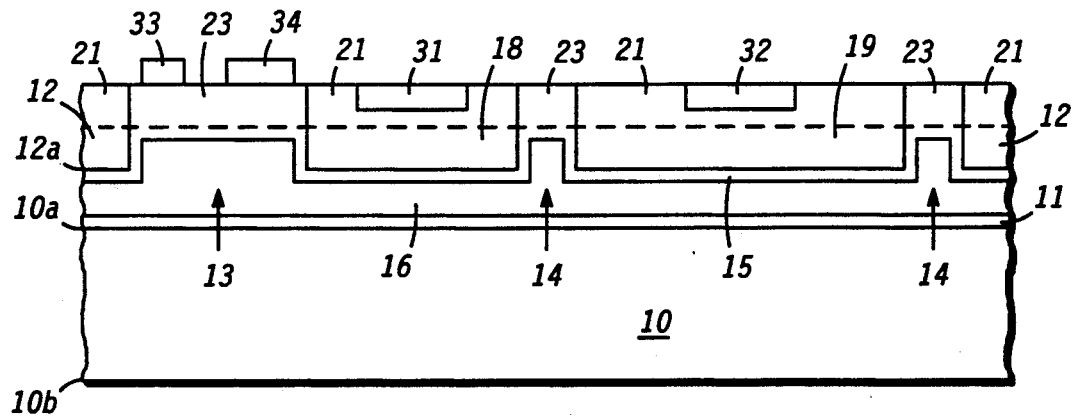

METHOD OF FABRICATING A DIELECTRIC ISOLATED AREA

BACKGROUND OF THE INVENTION

This invention relates, in general, to fabricating isolated regions on a semiconductor wafer, and more particularly, to a method of fabricating a dielectric isolated area.

Dielectric isolated circuits (DIC) are comprised of isolated, monosilicon islands electrically isolated from each other and from a supporting substrate by a dielectric material. The dielectric material, generally silicon dioxide or silicon nitride, provides excellent electrical isolation which reduces parasitic capacitances that adversely affect circuit performance. Dielectric isolation provides for better isolation than other conventional isolation techniques.

Traditional dielectric isolated circuits have been fabricated by etching a moat in a silicon substrate, and subsequently oxidizing and refilling the moat with a thick, high resistivity polysilicon layer, which is used as a handle wafer. The non-deposited side of the silicon substrate is then ground and polished back to the bottom of the etched moat for formation of the isolated silicon islands. Deposition of the thick polysilicon layer on one side of the substrate causes severe wafer warpage, which is disadvantageous for integrated circuit manufacturing. Another disadvantage of this process is its high cost of manufacturing, because of its complexity and resultant low yield. Although dielectric isolated structures provide the ideal structure for monolithic microwave integrated circuits, usage of dielectric isolated circuit processing has been limited due to its disadvantages.

Accordingly, it would be desirable to provide an improved method of fabricating dielectric isolated areas on semiconductor wafers.

SUMMARY OF THE INVENTION

The advantages of the present invention are achieved by a method of fabricating a dielectric isolated area by first providing a first and a second wafer, each having a first and a second surface. Trenches are then formed in the first surface of the second wafer. Subsequently, a dielectric layer which can be planarized is formed on the first surface of the second wafer and in the trenches of the second wafer. Then, the first and the second wafers are bonded together so that the dielectric layer and the first surface of the first wafer are bonded to each other. A portion of the second surface of the second wafer is removed down to at least to the bottom of each trench.

BRIEF DESCRIPTION OF THE DRAWINGS

FIGS. 1-8 illustrate enlarged, cross-sectional views of an embodiment of the present invention during various stages of processing.

DETAILED DESCRIPTION OF THE PREFERRED EMBODIMENT

Figure 1:
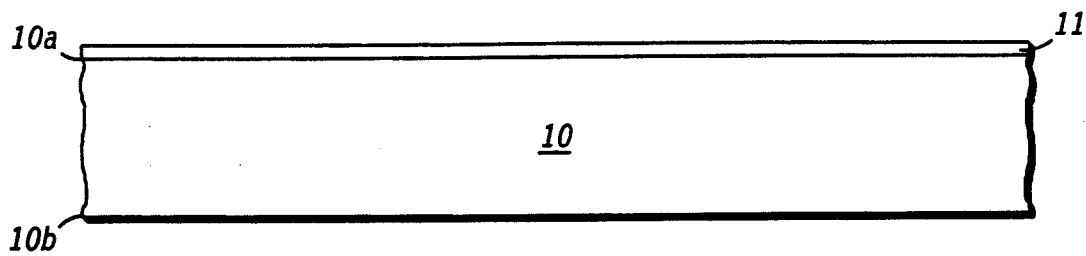

FIG. 1 illustrates a cross-sectional view of a handle wafer 10, having a first major surface 10a and a second major surface 10b. In a preferred embodiment, handle wafer 10 is comprised of a high resistivity (preferably greater than 5000 ohm-cm) polysilicon wafer. The polysilicon wafer is preferably formed by chemical vapor deposition at a high temperature and a high deposition rate to produce a polysilicon ingot having very dense grain size. This method is well known by those skilled in the art. The dense grain size of the polysilicon ingot allows for the slicing and polishing of the ingot into wafers without any grain chipping. Polishing of handle wafer 10 may not be necessary. The structure of the present invention can be fabricated at a low cost, especially when handle wafer 10 is comprised of a polysilicon wafer. Alternatively, handle wafer 10 may be comprised of a high resistivity single crystal silicon wafer. It is desirable for handle wafer 10 to have a high resistivity to reduce the conductive loss of devices to be fabricated thereon. Therefore, it is preferable that handle wafer be comprised of high resistivity polysilicon because the cost of high resistivity polysilicon wafers is very inexpensive, compared to the cost of high resistivity single crystal silicon wafers. A dielectric layer 11 is then formed on surface 10a of handle wafer 10 by using conventional means, such as oxidation or deposition. Dielectric layer 11 should be at least thick enough to prevent dopant from a planarizable dielectric layer (shown in FIG. 3) from diffusing into handle wafer 10. This thickness is approximately 0.1 to 1.0 microns.

Figure 2:
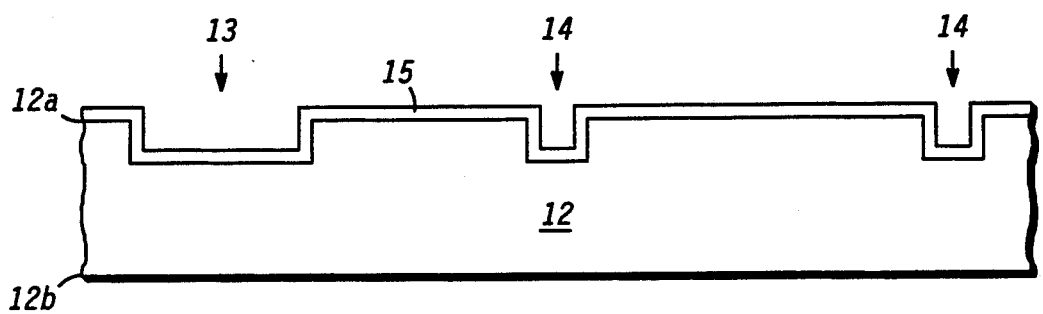

FIG. 2 illustrates a cross-sectional view of a substrate wafer 12, having a first major surface 12a and a second major surface 12b. In this embodiment, substrate wafer 12 is comprised of a P-type silicon substrate wafer having a resistivity in the range of 1 to 50 ohm-cm, however, other resistivities and the opposite dopant type may be used for different embodiments. Trenches 13 and 14 are formed in substrate wafer 12 by standard photolithography and etch processes. The use of a reactive ion etch process is desirable to form trenches 13 and 14. The depth of trenches 13 and 14 is preferably approximately at least 2 microns. Note that the width of trench 13 is shown larger than the width of trench 14. The width of trench 13 is chosen so that passive components, such as capacitors, inductors, or transmission lines, (shown in FIG. 8) may be formed in that region. The size of trenches 14 used for device isolation is determined by photolithographic constraints and the required electrical isolation between each portion of active islands 18 and 19 to be formed (shown in FIG. 5). A dielectric layer 15 is then formed on surface 12a of substrate wafer 12 by using conventional means, such as oxidation or deposition. Dielectric layer 15 should be at least thick enough to prevent dopant from a planarizable dielectric layer 16 (shown in FIG. 3) from diffusing into substrate wafer 12. This thickness is approximately 0.1 to 1.0 microns.

Figure 3:
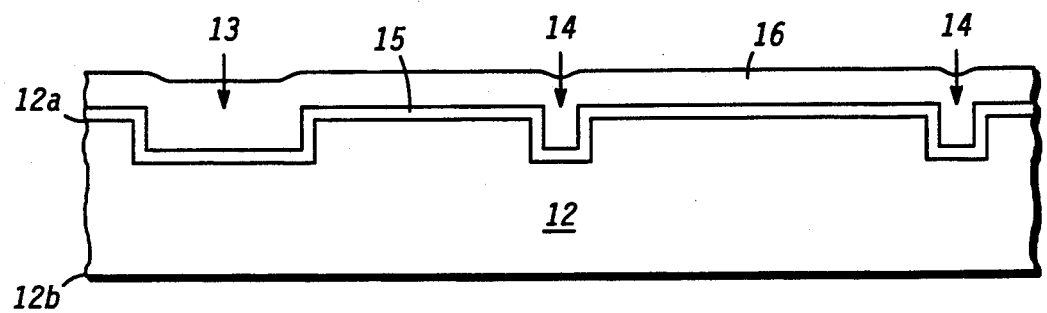

FIG. 3 illustrates the structure of FIG. 2 further along in processing. A dielectric layer 16 which can be planarized is formed on surface 12a of substrate wafer 12. For example, dielectric layer 16 may be comprised of polysilicon, nitride, or a silicon dioxide which is formed on surface 12a and subsequently planarized by polishing. Dielectric layer 16 may also be comprised of a reflowable glass. A reflowable glass is a glass that can be planarized by reflowing it at a low temperature. At the present time, available reflowable glass can be comprised of a boron-phosphorous silicate glass (BPSG), a boron, phosphorus or arseno-silicate glass (BSG, PSG or AsSG), an arseno-phosphosilicate glass (AsPSG), or a phospho-germano-silicate glass (PGSG). However, in the future, it may be possible that a reflowable glass, such as germano-silicate glass, may be developed which does not act as a dopant source. When dielectric layer 16 is comprised of polysilicon, nitride, a silicon dioxide, or a reflowable glass as described in the previous sentence, dielectric layers 11 (shown in FIG. 1) and 15 will not be required, because the purpose of dielectric layers 11 and 15 is to prevent the diffusion of dopants from the reflowable glass to handle wafer 10 and substrate wafer 12. The reflowable glass can be applied by using a chemical vapor deposition, a spin-on, or a sol-gel process. Enough reflowable glass must be deposited to fill trenches 13 and 14. A heat treatment, typically carried out at a temperature of approximately 700 to 1200° C., is performed to reflow the reflowable glass in order to densify the reflowable glass, to uniformly fill trenches 13 and 14, and to generally planarize the surface of the reflowable glass. Depending on the reflowable glass process used or the depth of trenches 14, it may be desirable to mechanically polish the reflowable glass to obtain a more planar surface.

Figure 4:
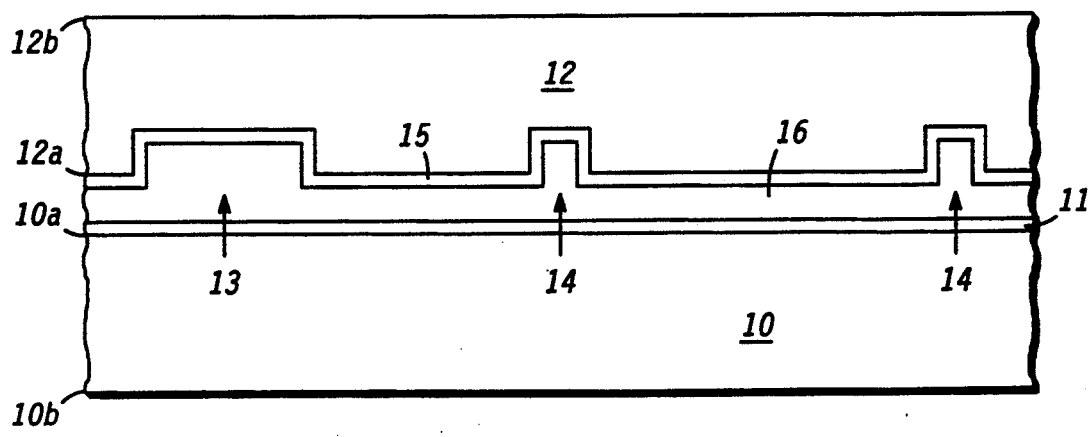

FIG. 4 illustrates a cross-sectional view of the structure of FIG. 3 bonded to the structure of FIG. 1 further along in processing. Substrate wafer 12 is bonded to handle wafer 10, such that dielectric layer 11 and dielectric layer 16 are bonded to each other. Either thermal or anodic bonding may be used. In the case where dielectric layers 11 and 15 are not used, surface 10a of handle wafer 10 and dielectric layer 16 would be bonded to each other. Dielectric layer 16 for wafer bonding reduces the process complexity and manufacturing cost of wafer bonding.

FIG. 5 illustrates the structure of FIG. 4 further along in processing. After bonding, a portion of substrate wafer 12 is removed down to at least the bottom of trenches 13 and 14 to expose dielectric layer 15 formed in trenches 13 and 14 (or dielectric layer 16 when dielectric layer 15 is not used). An example of the removal process entails conventional grinding of substrate wafer 12 down to approximately 10–25 microns above dielectric layer 15 in trenches 14. Substrate 12 is then subsequently chemically etched to remove a portion of substrate 12 that was damaged during the grinding process. Finally, chemical and mechanical polishing is used to polish substrate 12 at least down to the top of trenches 13 and 14 (which was previously the bottom of trenches 13 and 14 as shown in FIG. 2). In this example, dielectric layer 15 serves as a etch-stop for the chemical and mechanical polishing step, because the chemical polishing of a dielectric layer 15 is much slower than the chemical polishing of substrate 12, when a silicon-etch slurry such as colloidal silicate is used for polishing. Planarizable dielectric layer 16 would also serve as a etch-stop if dielectric layer 15 is not used. The improved planarity and built in etch-stop during polishing of substrate layer 12 allow for flexibility in manufacturing.

At this point, semiconductor devices may be fabricated in substrate layer 12, and passive components, including transmission lines, may be fabricated on the surface of dielectric layer 15 or planarizable dielectric layer 16 in the area of a trench 13. The above example is not shown in FIG. 5; an example of forming a dielectric isolated monolithic microwave integrated circuit (DIMMIC) will be described hereinafter. To form DIMMIC devices, a portion of substrate 12 is preferably doped N type to form an N+ type buried layer 18, and another portion of substrate 12 is preferably doped P type to form a P+ type buried layer 19. The formation of buried layers 18 and 19 is performed by any conventional diffusion methods.

FIG. 6 illustrates the structure of FIG. 5 further along in processing. An epitaxial layer 21 is grown on the surface of buried layers 18 and 19. Simultaneously during the growth of epitaxial silicon layer 21 over substrate regions 12, a polysilicon layer 23 will form over the regions of the previously etched trenches 14. In this embodiment, epitaxial layer 21 is preferably doped N type, but obviously other types of devices may require epitaxial layer 21 to be doped P type. For this application, epitaxial layer 21 is preferably of a thickness of approximately 1 micron, but other thicknesses may be readily used.

FIG. 7 illustrates the structure of FIG. 6 further along in processing. Polysilicon regions 23 are converted into thermal oxide region 23, by thermal oxidation. The surface of epitaxial layer 21 is masked (not shown) to prevent oxidation in that area.

FIG. 8 illustrates the structure of FIG. 7 further along in processing. In this embodiment, bipolar transistors 31 and 32 are formed in epitaxial layer 21. Note that other types of semiconductor devices may also be formed. Passive components, such as a inductor 33 and a capacitor 34 are then fabricated on top of thermal oxide layer 23 in the area of trench 13. Building passive components, including transmission lines, on thermal oxide layer 23 results in low electrical losses at high frequency. Bipolar transistors 31 and 32, inductor 33, and capacitor 34 are illustrated by simple regions only for illustrative convenience. The formation of such devices is well known in the art.

It has been shown that the substrate structure of the present invention provides for better circuit performance resulting from low parasitic capacitance and low electrical losses at high frequency. The low electrical losses at high frequency result from building passive components, including transmission lines, on a dielectric layer rather than doped silicon. The high resistivity of handle wafer 10 further reduces the conductive loss of the devices built in the structure of the present invention. The structure of the present invention can be fabricated at a low cost, especially when handle wafer 10 is comprised of a polysilicon wafer. The process of fabricating the present invention is more manufacturable than the polysilicon trench refill and polishing back of the substrate process of the prior art. The improved planarity and built in etch stop during polishing of substrate layer 12 allow for flexibility in manufacturing. Dielectric layer 16 for wafer bonding reduces the process complexity and manufacturing cost.

We claim:

1. A method of fabricating a dielectric isolated area, comprising the steps of:
   providing a first wafer having a first and a second surface;
   providing a second wafer having a first and a second surface;
   forming trenches in the first surface of the second wafer;
   forming a planarizable dielectric layer on the first surface of the second wafer and in the trenches of the second wafer;
   bonding the first and the second wafers so that the planarizable dielectric layer and the first surface of the first wafer and bonded to each other;
   removing a portion of the second surface of the second wafer down to at least the bottom of each trench;

simultaneously growing an epitaxial layer over the second surface of the second wafer and a polysilicon layer over the bottom of each trench after the step of removing a portion of the second surface of the second wafer; and oxidizing the polysilicon layer to form a thermal oxide.

2. The method of claim 1 including using a polysilicon wafer for the first wafer.

3. The method of claim 1 including using an unpolished polysilicon wafer for the first wafer.

4. The method of claim 1 including using a reflowable glass for the planarizable dielectric layer, and wherein the flowable glass is planarized by heating at a low temperature.

5. The method of claim 1 further comprising the step of paganizing the dielectric layer by polishing.

6. The method of claim 1 wherein the removing a portion of the second surface of the second wafer is comprised of chemical etching and mechanical polishing, wherein the planarizable dielectric layer is used as an etch-stop.

7. The method of claim 1 further comprising the steps of:

forming a first dielectric layer on the first surface of the first wafer prior to bonding; and forming a second dielectric layer on the first surface of the second wafer prior to forming the planarizable dielectric layer.

8. The method of claim 1 further comprising the steps of:

forming semiconductor devices in the epitaxial layer; and forming passive components, including transmission lines, over the thermal oxide.

9. A method of fabricating a dielectric isolated area, comprising the steps of:

providing a first wafer having a first and a second surface;

forming a first dielectric layer on the first surface of the first wafer;

providing a second wafer having a first and a second surface;

forming trenches in the first surface of the second wafer;

forming a second dielectric layer on the first surface of the second wafer and in the trenches of the second wafer;

forming a planarizable dielectric layer on the second dielectric layer;

bonding the first and the second wafers so that the planarizable dielectric layer and the first dielectric layer are bonded to each other;

removing a portion of the second surface of the second wafer so that tat least the second dielectric layer is exposed;

simultaneously growing an epitaxial layer over the second surface of the second wafer and a polysilicon layer over the second dielectric layer after the step of removing a portion of the second surfaces of the second wafer; and oxidizing the polysilicon layer to form a thermal oxide.

10. The method of claim 9 including using a polysilicon wafer for the first wafer.

11. The method of claim 9 including using an unpolished polysilicon wafer for the first wafer.

12. The method of claim 9 including using reflowable glass for the planarizable dielectric layer, and wherein the reflowable glass is planarized by heating at a low temperature.

13. The method of claim 9 further comprising the step of planarizing the dielectric layer by polishing.

14. The method of claim 9 wherein the removing a portion of the second surface of the second wafer is comprised of chemical etching and mechanical polishing, wherein the second dielectric layer is used as an etch-stop.

15. The method of claim 9 wherein the planarizable dielectric layer comprises a boron-phosphate doped silicate glass or a boron doped glass.

16. The method of claim 9 further comprising the step of forming integrated circuits in the second wafer.

17. The method of claim 9 further comprising the steps of:

forming semiconductor devices in the epitaxial layer; and forming passive components, including transmission lines, over the thermal oxide.

18. A method of fabricating a dielectric isolated area, comprising the steps of:

providing a polysilicon wafer having a first and a second surface;

oxidizing the first surface of the polysilicon wafer to form a first dielectric layer on the first surface of the polysilicon wafer;

providing an oxidizable wafer having a first and a second surface;

forming trenches in the first surface of the oxidizable wafer;

oxidizing the first surface of the wafer to form a second dielectric layer on the first surface of the wafer;

forming a planarizable dielectric layer on the second dielectric layer and in the trenches of the wafer;

bonding the polysilicon wafer and the wafer so that the planarizable dielectric layer and the first dielectric layer are bonded to each other;

removing a portion of the second surface of the wafer, utilizing the second dielectric layer as an etch stop;

simultaneously growing an epitaxial layer over the second surface of the wafer and a polysilicon layer over the second dielectric layer after the step of removing a portion of the second surface of the wafer; and oxidizing the polysilicon layer to form a thermal oxide.

19. The method of claim 18 wherein removing a portion of the second surface of the wafer is comprised of chemical etching and mechanical polishing.

20. The method of claim 18 including using a reflowable glass for the planarizable dielectric layer, and wherien the reflowable glass is planarized by heating at a low temperature.

21. The method of claim 18 further comprising the step of planarizing the dielectric layer by polishing.

22. The method of claim 18 including using a planarizable dielectric layer comprised of a boron-phosphate doped silicate glass or a boron doped glass.

23. The method of claim 18 further comprising the step of forming integrated circuits in the wafer.

24. The method of claim 18 further comprising the steps of:

forming semiconductor devices in the epitaxial layer; and forming passive components, including transmission lines, over the thermal oxide.

* * * * *